United States Patent [19]

Lee

[11] Patent Number: 4,887,198
[45] Date of Patent: Dec. 12, 1989

[54] ELECTRONIC LARGE CURRENT SWITCH FOR A SINGLE POWER CIRCUIT

[75] Inventor: Youn S. Lee, Seoul, Rep. of Korea
[73] Assignee: Jang B. Lee
[21] Appl. No.: 162,751
[22] Filed: Mar. 1, 1988
[51] Int. Cl.[4] ............................................. H02M 3/338
[52] U.S. Cl. ........................................ 363/18; 363/22; 363/89; 323/289
[58] Field of Search ...................................... 363/18–23, 363/89; 323/289, 282, 273

[56] References Cited

U.S. PATENT DOCUMENTS 3,012,181 12/1961 Schultz .................................... 363/22
4,239,989 12/1980 Brajder .................................. 323/289

Primary Examiner—Patrick R. Salce
Assistant Examiner—Emanuel Todd Voeltz
Attorney, Agent, or Firm—Darby & Darby

[57] ABSTRACT

An electronic large current switch for a single power circuit has a DC-to-DC converter for low voltage transformation, the operation of which is controlled by a control switch or a periodic switching circuit and a switching transistor supplied with the low voltage output of the DC-to-DC converter as its base bias voltage and which controls the power supply to an electrical load circuit so as to be capable of minimzing the power loss of the switching transistor and making the product small and integrated.

5 Claims, 1 Drawing Sheet

ELECTRONIC LARGE CURRENT SWITCH FOR A SINGLE POWER CIRCUIT

BACKGROUND OF THE INVENTION

1. Field of the Invention

The present invention relates to an electronic large current switch for a single power circuit, and more particularly to an electronic switch applicable to a vehicle having a single DC power supply.

2. Description of the Prior Arts

The conventional switches typically used to control the power supply to electrical loads of a vehicle, such as lamps, window wipers, etc., are classified into mechanical relay switches and electronic switches.

The conventional relay switch has the disadvantages that the state of the contacts for the relay may be unstable and malfunctions of the contacts may occur due to external vibration or impact. Also, the state of the contacts deteriorates when foreign matter such as dust comes in contact with the contacts or when the contacts are partly corroded. Furthermore, when switching a large current load by such relay contacts, the contacts are apt to stick to each other or harm adjacent electronic instruments due to electric arcs which occur between the contacts.

On the other hand, the conventional electronic switch which uses a transistor as a switching element thereof is generally designed to switch a relatively small current load of approximately 2 to 3 amperes and thus the saturation voltage between the collector and the emitter of the switching transistor becomes a high level of 1 to 2 volts because the base current thereof is several tens to several hundreds of milliamperes in accordance with electrical characteristics such as the parameters or the operating condition of the switching transistor. If this type of electronic switch is used as a controller of the power supply for a vehicle, however, the switching transistor controls a large current load of 10 to 15 amperes supplied to the electrical loads. Thus, the power consumption by the switching transistor becomes relatively high and, accordingly, the switching transistor deteriorates quickly due to heat generation within the transistor. Hence, it is difficult to use the conventional electronic switch in a vehicle having a single power supply.

In order to solve the aforementioned problems of such electronic switch, a method for reducing the power consumption of the switching transistor may be considered. The method is to design a switching circuit with a lower saturation voltage by increasing the base current of the switching transistor. However, if a fixed bias type switching transistor using a base bias resistor is employed, the power consumption by the resistor is very high because of a large current load through the resistor and the high voltage difference across the resistor. Therefore, as the power consumption capacity of the resistor must be set high, the size of the resistor increases which in turn makes it difficult to manufacture the electronic switch small, and it can not be the solution to the problem of power loss.

The method of setting the bias voltage by connecting the bleeder type bias resistor to the switching transistor of a Darlington connection may also be considered, but the heat generation of the switching transistor which controls a large current load can not be reduced and the parameters of the transistor are changed due to the generated heat. Therefore, the use of a heat sink having a large surface area is inevitable to radiate the high heat generated within the switching transistor. However, the use of a heat sink alone is not so effective in handling the heat continuously generated in the transistor and accordingly, the switching transistor may not perform effectively and it is difficult to make the product small.

If the conventional electronic switch comprising the transistor as the switching element and the bias circuit is used as the controller of the power supply for a vehicle having a single power supply, the heat loss within the transistor increases and it is difficult to make the product small.

SUMMARY OF THE INVENTION

It is an object of the present invention to provide an improved electronic large current switch for a single power circuit which can minimize the power loss of a switching transistor and the resultant heat generation.

It is another object of the present invention to provide a compact electronic switch suitable for being adapted to a vehicle.

It is still another object of the present invention to provide an electronic switch the operation of which is not affected by external impacts, dust or humidity but which has excellent stability since its electronic elements can be manufactured integrally.

The above objects are inventively achieved in an electronic switch having a DC-to-DC converter by which the input voltage from a power source is lowered and a switching transistor which is driven by the lowered voltage and controls the power supply to the electrical loads of a vehicle. The low voltage output from the DC-to-DC converter is supplied to the base of the switching transistor with increased base current of approximately 1 ampere and thus the saturation voltage of the transistor can be set at the level of 0.2 to 0.4 volts.

BRIEF DESCRIPTION OF THE DRAWINGS

The present invention will now be described by way of illustrative example with reference to the accompanying drawings, in which.

DETAILED DESCRIPTION OF THE PREFERRED EMBODIMENTS

Figure 1:
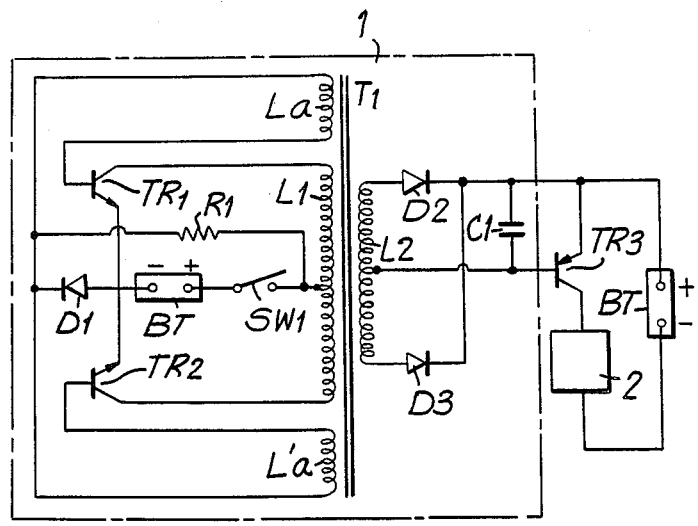
FIG. 1 is a circuit diagram showing an embodiment of the present invention.

Referring to FIG. 1 showing an embodiment of the present invention, rectifying diodes $D_2$ and $D_3$ and a smoothing condenser $C_1$ are connected to the secondary coil $L_2$ of a transformer $T_1$ in a Royer's DC-to-DC converter 1, which transforms the voltage of a battery BT for the vehicle to a low level. The low voltage output from this DC-to-DC converter 1 is then applied to the base of the switching transistor $TR_3$. Between the emitter and the collector of the switching transistor $TR_3$, the electrical load circuit 2 and the battery BT are connected in series. The electrical load circuit 2 may be composed of various vehicle lamps such as headlights, turn indicators, brake lights and a window wiper driving motor.

The DC-to-DC converter 1 in the preferred embodiments is an oscillator employing the magnetic saturation of the core, i.e., employing the magnetization characteristic of the core in the transformer $T_1$, wherein the magnetic flux density at first increases according to the increase of the magnetic field intensity but does not change further beyond the saturation point thereof. In other words, when the control switch $SW_1$ connected to the primary coil $L_1$ of the transformer $T_1$ in the DC-to-DC converter 1 is turned on, the 12 VDC power supply from the battery BT is applied to the primary coil $L_1$ and accordingly, the driving current is applied to each base of transistors $TR_1$ and $TR_2$ through the resistor $R_1$ and the other primary coils La and La' respectively. In this instance, one of the transistors $TR_1$ and $TR_2$ is turned on first depending on the characteristics of the parameters of the transistors. For example, if the transistor $TR_1$ is turned on first, the collector current thereof flows through the coil $L_1$ and thus the transistor $TR_1$ can be saturated according to the increase of the base current of the transistor $TR_1$ which is due to the increase of the voltage induced in the coil La by the coil $L_1$. Therefore, with the increase of the current through the coil $L_1$, the magnetic flux density of the core reaches the saturation point where there is no change of the magnetic field and thus no further voltage is induced in the coil La as described above resulting in that the transistor $TR_1$ is turned off. After the transistor $TR_1$ is turned off, the transistor $TR_2$ becomes turned on and the same circuit operation is repeated as mentioned above. Consquently, by repeating 'turn on' and 'turn off' operations of each of the transistors $TR_1$ and $TR_2$, an AC voltage is induced in the secondary coil $L_2$ of the transformer $T_1$. The level of the AC voltage induced in the secondary coil $L_2$ can be lowered sufficiently to be used as the bias voltage of the switching transistor $TR_3$ by adjusting the turn ratio of the primary and secondary coils $L_1$ and $L_2$ of the transformer $T_1$.

Then, the voltage induced in this way becomes a full waved rectified voltage through the diodes $D_2$ and $D_3$, smoothed through the condenser $C_1$ and then applied to the switching transistor $TR_3$ as the base bias voltage thereof. Thus, the switching transistor $TR_3$ is turned on and the power supply is connected to the load circuit 2 through the transistor $TR_3$.

In the preferred embodiments, the saturation voltage of the switching transistor $TR_3$ can be lowered about 0.3 volts by increasing its base current to the level of about 1 ampere and accordingly, it is possible to minimize the power loss in the switching transistor $TR_3$. Thus, the heat generation in the switching transistor $TR_3$ is also minimized and neither the heat sink for heat radiation nor the bias resistor having a high power consumption capacity is necessary. In the aforementioned state, if the control switch $SW_1$ in the DC-to-DC converter 1 is turned off, the power supply to each of the primary coils $L_1$, La and La' of the transformer $T_1$ is cut out and then both transistors $TR_1$ and $TR_2$ are turned off. Therefore, the DC-to-DC converter 1 stops its operation and the base bias voltage applied to the switching transistor $TR_3$ is cut off and thus the switching transistor $TR_3$ is turned off, causing the power supply from the battery BT to the load circuit 2 to be cut off.

Meanwhile, in the preferred embodiment of the present invention, other switching circuits can be employed according to the characteristics of the electrical load circuit 2 instead of the control switch $SW_1$ in the DC-to-DC converter 1. For example, instead of the control switch $SW_1$, a periodic switching circuit such as control circuits of the turn indicators and the wiper driving motor could be employed.

Figure 2:
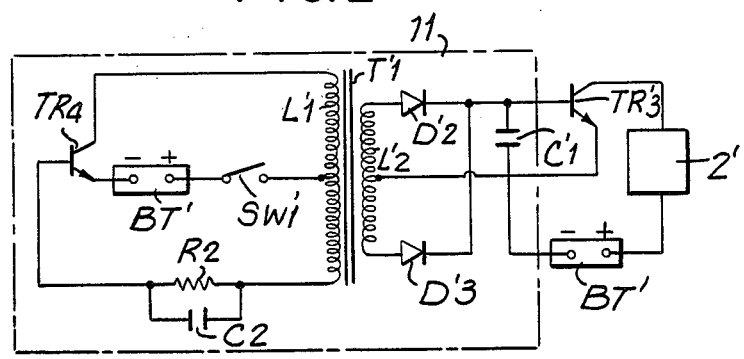
FIG. 2 is a circuit diagram showing another embodiment of the present invention.

Referring now to FIG. 2, there is shown another embodiment of the present invention. Each element having the same function as a part in FIG. 1 has the same reference number with an apostrophe. In this embodiment, a ringing choke converter 11 is used instead of the Royer's DC-to-DC converter, and magnetic saturation characteristics are also employed. If the control switch $SW_1'$ is turned on, the driving current from the battery BT' is applied to the base of a transistor $TR_4$ through the primary coil $L_1'$ of the transformer $T_1'$, a resistor $R_2$ and a condenser $C_2$ connected in parallel. Thus, the transistor $TR_4$ is turned on, and the collector current of the transistor $TR_4$ flows through the primary coil $L_1'$ of the transformer $T_1'$.

Therefore, the voltage induced in the coil $L_1'$ increases and thus the base current of the transistor $TR_4$ also increases resulting in that the magnetic flux density reaches the saturation point when the transistor $TR_4$ is turned off as described above. At this moment, the voltage charged in the condenser $C_2$ is then discharged through the resistor $R_2$. After the completion of the discharge, the transistor $TR_4$ becomes turned-on, and thus the above described operations are repeated. Consequently, the transistor $TR_4$ acts as an oscillator by repeating 'turn on' and 'turn off' operations and accordingly, an AC voltage is induced in the secondary coil $L_2'$ of the transformer $T_1'$. Hence, the switching transistor $TR_3'$ is turned on and the power supply from the battery BT' is connected to the electrical load circuit 2'.

In the preferred embodiments of the present invention, any type of a DC-to-DC converter for low voltage transformation can be employed instead of the Royer's DC-to-DC converter, and the ringing choke converter 11 as described above.

Also, a field effect transistor may be employed as the switching transistor instead if the switching noise is a critical problem.

From the foregoing, it will be apparent that the present invention provides a novel electronic large current switch specially designed to minimize the power loss of the switching transistor therein and to make the product small and integrated so that it is suitable for being adapted to a vehicle having a single power supply.

While the present invention has been described and illustrated herein with reference to the preferred embodiments thereof, it will be understood by those skilled in the art that various changes in form and details may be made therein without departing from the spirit and scope of the invention.

What is claimed is:

1. An electronic large current switch for a single power circuit especially adapted for vehicle use comprising:
   a DC-to-DC converter for low voltage to lower voltage transformation which is controlled by a control switch or a periodic switching circuit; and
   a switching transistor supplied with the low voltage output of said DC-to-DC converter as the base bias voltage thereof and which controls the power supply to an electrical load circuit, said output of said DC-to-DC converter providing increased base current to said switching transistor in order to substantially lower the saturation voltage of said switching transistor and thereby minimize power loss of the switching transistor.

2. The switch of claim 1 wherein the DC-to-DC converter is of the Royer type.

3. The switch of claim 1 wherein the DC-to-DC converter is of the ringing coil type.

4. The switch of claim 1 wherein a vehicle battery is the source of electrical power for the switch.

5. The switch of claim 1 wherein the base current of said switching transistor is raised to about 1 ampere and the collector voltage is reduced to about 0.3 volts.

* * * * *